(12) United States Patent
Saint-Laurent et al.

(10) Patent No.: US 7,746,137 B2
(45) Date of Patent: Jun. 29, 2010

(54) SEQUENTIAL CIRCUIT ELEMENT INCLUDING A SINGLE CLOCKED TRANSISTOR

(75) Inventors: Martin Saint-Laurent, Austin, TX (US); Baker Mohammad, Austin, TX (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/845,950

(22) Filed: Aug. 28, 2007

(65) Prior Publication Data

US 2009/0058463 A1 Mar. 5, 2009

(51) Int. Cl.
*H03K 3/356* (2006.01)
(52) U.S. Cl. ............................ 327/200; 326/98; 327/211
(58) Field of Classification Search .................... 326/31, 326/33–34, 46, 93–98; 327/199–213, 530–550; 365/154–156, 205
See application file for complete search history.

(56) References Cited

U.S. PATENT DOCUMENTS

| | | | |
|---|---|---|---|
| 4,768,167 A | 8/1988 | Yoder | |
| 5,557,225 A | 9/1996 | Denham et al. | |
| 5,764,089 A * | 6/1998 | Partovi et al. | 327/200 |
| 5,825,225 A | 10/1998 | Sugisawa et al. | |
| 5,883,529 A | 3/1999 | Kumata et al. | |
| 6,459,316 B1 * | 10/2002 | Vangal et al. | 327/202 |
| 6,597,223 B2 * | 7/2003 | Vangal et al. | 327/202 |
| 6,701,339 B2 * | 3/2004 | Vangal et al. | 708/709 |
| 6,937,079 B1 * | 8/2005 | Zhao et al. | 327/200 |
| 7,042,267 B1 | 5/2006 | Pasqualini | |
| 7,046,066 B2 | 5/2006 | Saado et al. | |
| 7,180,350 B2 * | 2/2007 | Hsieh et al. | 327/218 |
| 7,180,351 B2 * | 2/2007 | Hsieh et al. | 327/218 |
| 7,492,203 B2 * | 2/2009 | Kim | 327/218 |
| 7,525,361 B2 * | 4/2009 | Kim | 327/208 |
| 2006/0181322 A1 * | 8/2006 | Kim et al. | 327/206 |
| 2006/0214695 A1 * | 9/2006 | Lih et al. | 326/98 |

(Continued)

FOREIGN PATENT DOCUMENTS

EP 0401865 12/1990

(Continued)

OTHER PUBLICATIONS

International Search Report—PCT/US08/074622—International Search Authority, European Patent Office—Oct. 9, 2008.

(Continued)

*Primary Examiner*—James H. Cho
*Assistant Examiner*—Matthew C Tabler
(74) *Attorney, Agent, or Firm*—Nicholas J. Pauley; Peter Kamarchik; Sam Talpalatsky (57) ABSTRACT

A method is disclosed that includes propagating data via a first data path of a sequential circuit element in response to a clock signal received at a single clocked transistor of the sequential circuit element. The method also includes retaining information related to the data propagated via the first path at a retention circuit element of a second data path, where the first data path includes a first transistor that is responsive to an output of the single clocked transistor. The first transistor has a higher current flow capacity than a second transistor associated with the second data path.

37 Claims, 7 Drawing Sheets

U.S. PATENT DOCUMENTS

2009/0108895 A1    4/2009    Saint-Laurent et al.

FOREIGN PATENT DOCUMENTS

| JP | 62188515 | 8/1987 |
| JP | 2003-133916 | 5/2003 |

OTHER PUBLICATIONS

Written Opinion—PCT/US08/074622—International Search Authority, European Patent Office—Oct. 9, 2008.

European Search Report-EP08006405, Search Authority-The Hague-Oct. 16, 2008.

European Search Opinion-EP08006405, Search Authority-The Hague-Oct. 16, 2008.

* cited by examiner

SEQUENTIAL CIRCUIT ELEMENT INCLUDING A SINGLE CLOCKED TRANSISTOR

BACKGROUND

I. Field

The present disclosure is generally related to a sequential circuit element including a singled clocked transistor.

II. Description of Related Art

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Generally, digital integrated circuits used for portable personal computing devices, such as wireless telephone devices, utilize clock signals for data processing. Dissipation of a clock signal from a clock source as it propagates through an integrated circuit can account for a large portion of the overall dynamic power consumption of the integrated circuit. In circuits that include sequential elements, such as flip-flop circuits and latch circuits, the clock power consumed by the sequential element may be determined, in part, by the capacitance of the transistors that switch when the clock switches. These clocked devices may be directly connected to the primary clock input. Alternatively, these clocked devices may use internal clocks derived from the primary clock input to control transistor operation an timing.

In general, switching transistors associated with the sequential circuit element results in power dissipation through the charging and discharging of transistor capacitances as well as wire capacitances associated with the wiring interconnects. Hence, there is a need for improved sequential circuit element devices and methods of reducing power consumption.

SUMMARY

In a particular embodiment, a method is disclosed that includes propagating data via a first path of a sequential circuit element in response to a clock signal received at a single clocked transistor of the sequential circuit element. The sequential circuit element further includes a second path coupled to the first path. The method also includes retaining information related to the data propagated via the first path at a retention circuit element of the second path, where the first path includes a first transistor that is responsive to an output of the single clocked transistor. The first transistor has a higher current flow capacity than a second transistor associated with the second path.

In another particular illustrative embodiment, a circuit device is disclosed that includes a clock bus and a plurality of sequential circuit elements. Each of the sequential circuit elements has a single clocked transistor including a control terminal coupled to the clock bus and including an output terminal coupled to at least one element of a logic circuit. A voltage level at the output terminal switches between a virtual ground voltage level and a floating voltage level in response to receiving a clock signal via the clock bus to selectively activate the logic circuit to shift data from a data input to a data output.

In still another particular embodiment, a method is disclosed that includes receiving a clock signal at a clock input of a sequential circuit element. The clock input is coupled to a control terminal of a clocked transistor. When the clock signal is high, data is propagated from a data input to a data output of the sequential circuit element via a first data path having a first transistor responsive to the output terminal. When the clock signal is low, state information related to the data is retained at the data output via a second data path having a second transistor coupled to the first data path. The control terminal of the clocked transistor receives the clock signal and the output of the clocked transistor provides a switched voltage supply to the first transistor in response to receiving the clock signal.

In yet another particular embodiment, a circuit device is disclosed that includes means for propagating data via a first path of a sequential circuit element in response to a clock signal received at a single clocked transistor of the sequential circuit element. The sequential circuit element includes a second path coupled to the first path. The circuit device further includes means for retaining information related to the data propagated via the first path at a retention circuit element of the second path. The first path includes a first transistor that is responsive to an output of the single clocked transistor. The first transistor has a higher current flow capacity than a second transistor associated with the retention circuit element.

One particular advantage provided by particular embodiments of a sequential circuit element including a single clocked transistor is provided in that power consumption is reduced. In particular embodiments of the sequential circuit element such as a latch circuit having a single clocked transistor, clock power consumption may be reduced to about ⅕th of the clock power consumption of a conventional latch circuit.

Another particular advantage is provided in that wiring interconnections for routing clock signals to sequential circuit elements of a circuit device, such as an integrated circuit, may be simplified. For example, a clock bus of the integrated circuit can be connected to a single clocked transistor of each sequential circuit element to provide an input clock by routing a wire to a terminal of a single clocked transistor of a sequential circuit element, rather than to each transistor of the sequential circuit element.

Other aspects, advantages, and features of the present disclosure will become apparent after review of the entire application, including the following sections: Brief Description of the Drawings, Detailed Description, and the Claims.

DETAILED DESCRIPTION

Figure 1:
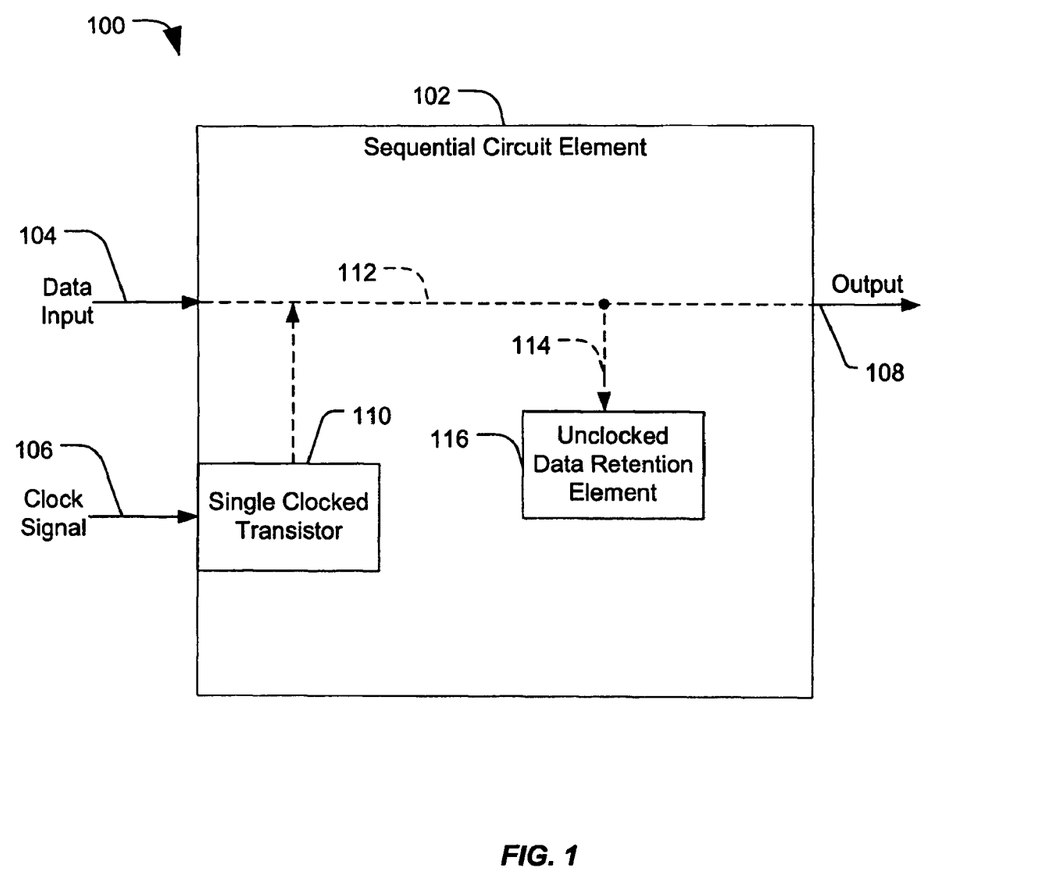
FIG. 1 is a block diagram of a particular illustrative embodiment of a system including a sequential circuit element that has a single clocked transistor.

FIG. 1 is a block diagram of a particular illustrative embodiment of a system 100 that includes a sequential circuit element 102 that has a single clocked transistor 110. The sequential circuit element 102 includes a data input 104, a clock input 106 coupled to the single clocked transistor 110, and a data output 108. The data input 104 can be selectively coupled to the data output 108 via a first data path 112. The sequential circuit element 102 also includes a second data path 114 that is coupled to the first data path 112. The sequential circuit element 102 also includes an unclocked data retention element 116 that is adapted to retain information related to data propagated via the first data path 112.

Figure 3:
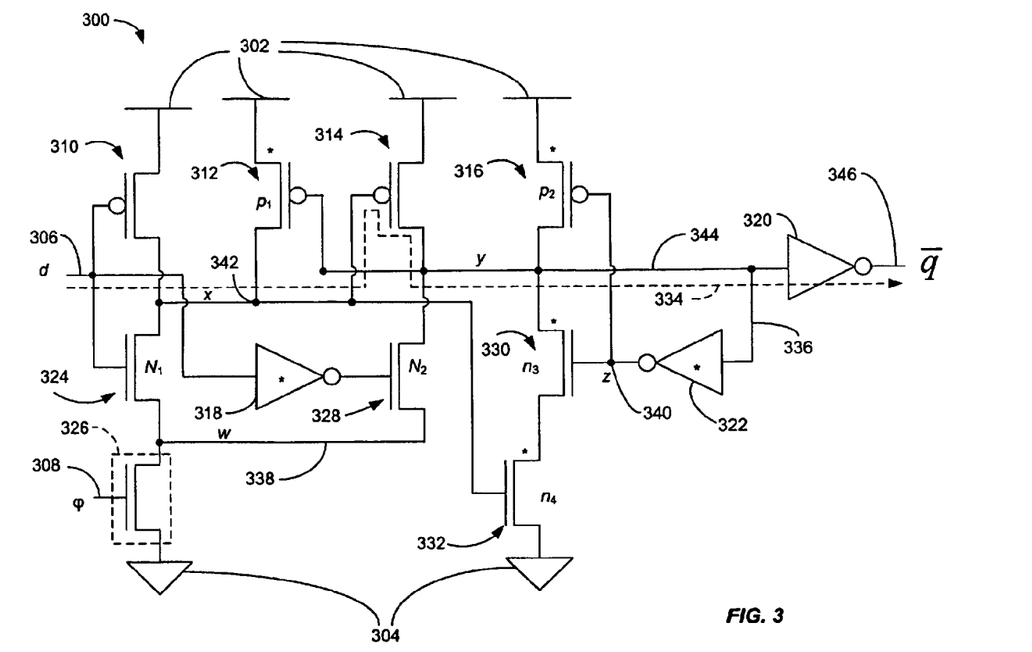
FIG. 3 is schematic diagram of a particular illustrative embodiment of a logical latch circuit device including a single clocked transistor.

In a particular illustrative embodiment, the single clocked transistor 110 is adapted to selectively activate the first data path 112 in response to receiving a clock signal via the clock input 106, by providing a switched voltage to at least one transistor (such as the transistor 324 in FIG. 3). When the received clock signal is high, data at the data input 104 can be propagated via the first data path 112 to the output 108. Additionally, such data is provided to the unclocked data retention element 116 via the second data path 114. When the received clock signal is low, the single clocked transistor 110 can deactivate the first data path 112 to prevent data at the data input 104 from propagating to the data output 108. Additionally, when the received clock signal is low, the unclocked data retention element 116 retains state information related to the data that was previously propagated via the first data path 112. The unclocked data retention element 116 can operate to control the data output 108 such that the data at the output 108 does not change when the clock signal at the clock input 106 is low.

In a particular illustrative embodiment, the sequential circuit element 102 may be utilized in connection with a wireless communications device, a portable personal computing device, another device, or any combination thereof In a particular illustrative embodiment, the sequential circuit element 102 can be used to build a logic latch circuit, a logic flip-flop circuit, another clocked circuit, or any combination thereof. Additionally, the clock signal can be provided to the single clocked transistor 110, but not to other circuit elements of the sequential circuit element 102.

Figure 2:
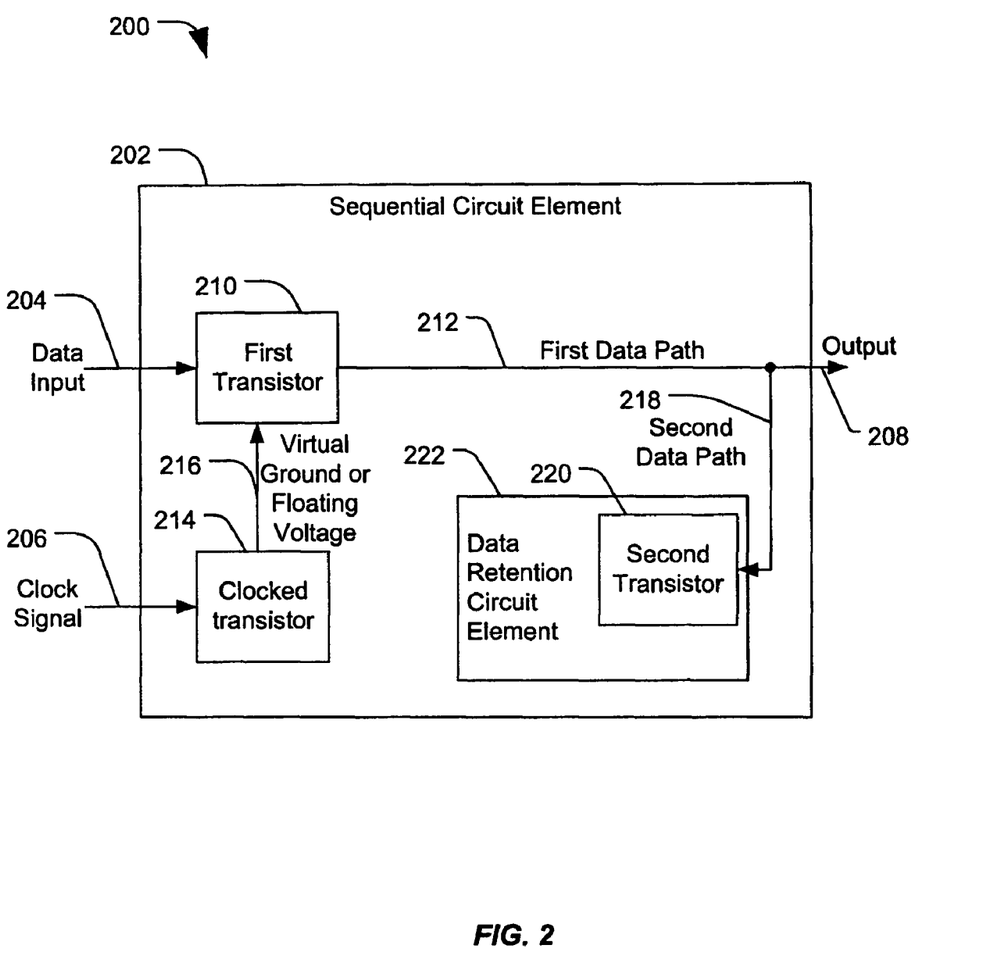
FIG. 2 is a block diagram of a second particular illustrative embodiment of a system including a sequential circuit element that has a single clocked transistor.

FIG. 2 is a block diagram of a second particular illustrative embodiment of a system 200 including a sequential circuit element 202 that has a single clocked transistor 214. The sequential circuit element 202 includes a data input 204, a clock input 206 coupled to the single clocked transistor 214, and a data output 208. Additionally, the sequential circuit element 202 includes a first transistor 210 coupled to the data input 204. The first transistor 210 is responsive to the clocked transistor 214 via a control line 216, which may be a switched voltage line that switches between a virtual ground voltage level and a floating voltage level to selectively activate the first transistor 210. In a particular illustrative embodiment, the virtual ground voltage level may be a logic zero voltage level. In another particular illustrative embodiment, the floating voltage level may represent a high impedance at the control line (or output terminal) 216. The sequential circuit element 202 also includes a first data path 212 that couples the first transistor 210 to the data output 208 and includes a second data path 218 that is coupled to the first data path 212. In general, multiple transistors may be interconnected between the first transistor 210 and the data output 208 to provide the first data path 212. The sequential circuit element 202 also includes a data retention circuit element 222 that includes a second transistor 220 and that is coupled to or that is part of the second data path 218.

In a particular illustrative embodiment, data is received at the data input 204. A clock signal is received at the clock input 206. When the clock signal is high at the clock input 206, the clocked transistor 214 provides a virtual ground voltage via the control line 216 to the first transistor 210, which activates the first transistor 210 to propagate the data at the data input 204 to the data output 208 via the first data path 212. Additionally, the data retention circuit element 222 receives state information via the second data path 218. The state information is related to the data propagated via the first data path 212. In a particular illustrative embodiment, the state information received by the data retention circuit element 222 via the second data path 218 represents the data presented at the data output 208. For example, if the data at the data output 208 represents a logic high voltage level, the state information stored at the data retention circuit element 222 also indicates a logic high voltage level.

In a particular illustrative embodiment, the first data path 212 includes the first transistor 210, which is responsive to an output (i.e., control line 216) of the single clocked transistor 214. In a particular illustrative embodiment, the first transistor 210 is stronger than a second transistor, such as the transistor 220, that is associated with the second path 218. In particular, the first transistor 210 is stronger than the second transistor 220 because the first transistor 210 has a higher current flow capacity than the second transistor 220, allowing the first transistor 210 to overcome any contention with the second transistor 220 to control data flow via the first data path 212. The first transistor 210 may have a greater width and/or a higher voltage threshold than the second transistor 220. For example, the first transistor 210 may be designed to carry more current than the second transistor 220, allowing the first transistor 210 to control data flow via the first data path 212. In a particular illustrative embodiment, the relative widths of the first transistor 210 and the second transistor 220 allow the circuit device 202 to operate as a latch circuit without having to wire the clock signal to each transistor to control the data flow. In a particular illustrative embodiment, the sequential circuit element 202 can be part of a logical latch circuit, a logical flip-flop circuit, a clocked circuit element, or any combination thereof.

In a particular illustrative, non-limiting embodiment, the retention circuit element 222 can be a node coupled to a transistor, such as the second transistor 220. In another particular illustrative embodiment, the data retention circuit element 222 may include two or more transistors, including the second transistor 220 and an inverter (shown in FIG. 3), wherein the inverter includes a first terminal coupled to the first data path 212 and a second terminal coupled to one of the two or more transistors. The data retention circuit element 222 can retain state information from an output of the inverter. In another particular illustrative embodiment, the sequential circuit element 202 can include a second retention circuit element (not shown) that can be coupled to the retention circuit element 222 or to the first data path 212 to retain information related to the data propagated via the first data path 212.

In a particular illustrative embodiment, the sequential circuit element 202 receives the clock signal via the clock input 206 at the single clocked transistor 214, but not at the first transistor 210 or the second transistor 220. The first and second transistors 210 and 220 are not clocked (i.e., the first and second transistors 210 and 220 do not receive the clock signal directly). By providing the clock signal to the single clocked transistor 214 but not to the first and second transistors 210 and 220, overall clock power consumption by the sequential circuit element 202 is reduced because a number of transistors having gate capacitances that dissipate power through switching is reduced. Additionally, by providing the clock signal to the single clocked transistor 214, the wire trace routing of the sequential circuit element (and of the overall circuit device) can be simplified, because wiring interconnections between the clock bus and each transistor, such as the first and second transistors 210 and 220, of the sequential circuit element 202 can be omitted.

In a particular illustrative embodiment, the data retention circuit element 222 is responsive to the first data path 212 and the second data path 218 to retain state information related to data propagated via the first data path 212. A logic value at the data output 208 can be latched (retained or stored) at the data retention circuit element 222 without directly applying the clock signal to the data retention circuit element 222. In particular, since the first transistor 210 is stronger than the second transistor 220 (i.e., has a higher current flow capacity), the clocked transistor 214 can control the first transistor 210 to propagate data from the data input 204 to the output 208 via the first data path 212 and to overpower the second transistor 220, such that the data retention circuit element 222 receives the propagated data. The second transistor 220 is responsive to data that is propagated via the first data path 212 and can operate to actively retain state information related to the propagated data.

FIG. 3 is schematic diagram of a particular illustrative embodiment of a sequential circuit element, such as the sequential circuit elements illustrated in FIGS. 1 and 2. In FIG. 3, the sequential circuit element is shown as a logical latch circuit device 300 that includes a single clocked transistor 326. The logical latch circuit device 300 includes voltage supply terminals 302 and 304, which may be a voltage supply (VDD) terminal 302 and a ground terminal 304, respectively. The circuit device 300 also includes a data input 306 to receive data and a clock input 308 to receive a clock signal, for example, from a clock bus.

The circuit device 300 includes multiple p-channel transistors 310, 312, 314, and 316 and multiple n-channel transistors 324, 326, 328, 330, and 332. The p-channel transistor 310 includes a first terminal coupled to the VDD terminal 302, a second terminal coupled to the data input 306, and a third terminal coupled to a node 342. The circuit device 300 also includes an n-channel transistor ($N_1$) 324 (e.g., the first transistor 210 in FIG. 2). The n-channel transistor ($N_1$) 324 includes a first terminal coupled to the node 342, a second terminal coupled to the data input 306, and a third terminal coupled to a node 338. The single clocked transistor 326 includes a first terminal coupled to the node 338, a second terminal responsive to the clock input 308, and a third terminal coupled to the ground terminal 304.

The p-channel transistor ($p_1$) 312 includes a first terminal coupled to the VDD terminal 302, a second terminal coupled to a node (y) 344, and a third terminal coupled to the node (x) 342. The p-channel transistor 314 includes a first terminal coupled to the VDD terminal 302, a second terminal coupled to the node (x) 342, and a third terminal coupled to the node (y) 344.

The data input 306 is coupled to an input of an inverter 318, which also includes an inverter output. The n-channel transistor ($N_2$) 328 includes a first terminal coupled to the node (y) 344, a second terminal coupled to the inverter output, and a third terminal coupled to the node (w) 338.

The p-channel transistor ($p_2$) 316 includes a first terminal coupled to the VDD terminal 302, a second terminal coupled to a node (z) 340, and a third terminal coupled to the node (y) 344. The n-channel transistor 330 ($n_3$) includes a first terminal coupled to the node (y) 344, a second terminal coupled to the node (z) 340, and a third terminal. The n-channel transistor ($n_4$) 332 includes a first terminal coupled to the third terminal of the n-channel transistor ($n_3$) 330, a second terminal coupled to the node (x) 342, and a third terminal coupled to the ground terminal 304. An inverter 320 couples the node (y) 344 to the data output 346, and an inverter 322 couples the node (y) 344 to the node (z) 340 via a line 336.

In a particular illustrative embodiment, the circuit device 300 represents a reduced contention latch circuit that propagates data (i.e., is transparent or at least substantially transparent) when a clock signal received by the single clocked transistor 326 is at a logic high level and that retains its state when the clock signal is at a logic low level. The p-channel transistors ($p_1$ and $p_2$) 312 and 316 and the n-channel transistors ($n_3$ and $n_4$) 330 and 332 are labeled in lowercase to indicate that they are relatively weak compared to the n-channel transistors ($N_1$ and $N_2$) 324 and 328. In a particular illustrative embodiment, the n-channel transistors ($N_1$ and $N_2$) 324 and 328 have a higher current flow capacity than the p-channel transistors ($p_1$ and $p_2$). In a particular illustrative embodiment, the p-channel transistors ($p_1$ and $p_2$) 312 and 316 and the n-channel transistors (n3 and n4) 330 and 332 may be long channel or high voltage threshold transistors relative to the n-channel transistors ($N_1$ and $N_2$) 324 and 328. When the clock signal ($\phi$) is high at the clock input 308, the data (d) at the data input 306 can propagate to the data output 346, such that a data value ($\overline{q}$) at the data output 346 is inverted relative to a value of the data (d) at the data input 306.

In a particular illustrative embodiment, when the clock signal ($\phi$) is high at the clock input 308, the single clocked transistor 326 is activated and a voltage level at the node (w) 338 is pulled down to a virtual ground voltage level. The virtual ground voltage level at node (w) 338 activates the n-channel transistor ($N_1$) 324, by providing a current path to ground 304 via the clocked transistor 326. Data (d) at the data input 306 is propagated via a first data path, generally indicated at 334. The data (d) is inverted at node (x) 342. In particular, when the clock signal is high, if the value of the data (d) is a logic high voltage level at the data input 306, the p-channel transistor 310 is inactive, the n-channel transistor 324 is active, and the n-channel transistor 324 pulls down the voltage level of the node (x) 342, so that the voltage level at the node (x) 342 is inverted relative to the voltage level of the data (d) at the data input 306. If the value of the data (d) is a logic low voltage level at the data input 306, the p-channel transistor 310 is active, which pulls up a voltage level at the node (x) 342 so that the voltage level at the node (x) 342 is inverted relative to the low voltage level of the data (d) at the data input 306.

A voltage level at the node (x) 342 is pulled down to a virtual ground voltage level (or a logic zero (0) voltage level) by the n-channel transistor ($N_1$) 324 when the clock signal at the clock input 308 is high. When the clock signal at the clock input 308 is low, the single clocked transistor 326 is inactive and a voltage level at the node (w) 338 is at a floating voltage level. When the node (w) 338 is floating, the n-channel transistor (N$_1$) 324 is inactive, because a current path to the ground terminal 304 through the single clocked transistor 308 is turned off.

The data (d) is inverted again at node (y) 344. In particular, the inverted data at node (x) 342 is received at a terminal of the p-channel transistor (p$_2$) 316. If a voltage level representing the data (d) at the node (x) 342 is low (i.e., the data (d) at the data input 306 is high), the p-channel transistor (p$_2$) 316 is active. Additionally, the voltage level at the gate of the n-channel transistor (N$_2$) 328 is low (i.e., turned off) because of the inverter 318. Thus, a voltage level at the node (y) 344 is pulled up by the p-channel transistor 314 (i.e., the voltage level at the node (y) 344 is inverted relative to the voltage level at the node (x) 342). If the voltage level is high at the node (x) 342 (i.e., the data at the data input 306 is low), the p-channel transistors 314 and (p$_2$) 316 are turned off. The voltage at the node (y) 344 is pulled low because the output of the inverter 318 is high, turning on the n-channel transistor 328. The data at node (y) 344 is received at a second data path 336 that couples the node (y) 344 to a data retention element, including the inverter 322, the node 340, the n-channel transistor (n$_3$) 330, and the p-channel transistor (p$_2$) 316.

In general, the p-channel transistors (p$_1$ and p$_2$) 312 and 316 and the n-channel transistors (n$_3$ and n$_4$) 330 and 332 are weak transistors relative to the n-channel transistors (N$_1$ and N$_2$) 324 and 328. The p-channel transistors (p$_1$ and p$_2$) 312 and 316 and the n-channel transistor (n$_3$) 330 are weak because they have less current carrying capacity than the n-channel transistors (N$_1$ and N$_2$) 324 and 328. Whenever the data (d) is inverted, at least one of the weak p-channel transistors 312 and 316 (sometimes referred to as keepers) briefly causes contention. However, the circuit device 300 does not rely on the weak p-channel transistors 312 and 316 to pull up the timing-critical nodes, such as the nodes (x and y) 342 and 344. When the clock signal (φ) is low, the single clocked transistor 326 is inactive and the node 338 (i.e., the output terminal of the single clocked transistor 326) is at a floating voltage level. The n-channel transistor (N$_1$) 324 turns off, and data (d) at the data input 306 is not propagated. The inverter 322, the node 340, the p-channel transistor (p$_2$) 316, the n-channel transistor (n$_3$) 330, and the p-channel transistor (p$_1$) 312 operate to retain state information related to the data propagated via the first data path 334.

When the data value at node 344 is at a logic high level, a logic level at node (z) 340 is forced to a logic low level by the inverter 322. The weak p-channel transistor (p$_2$) 316 is turned on by the low voltage level at the node (z) 344, so the voltage level of the node 344 is maintained at a logic high level, such that the output value at the data output 346 is maintained at a logic low level. In this particular scenario, the logic value at the node 342 can change without affecting the voltage level at the node (y) 344 because the transistor (n$_3$) 330 is turned off. Alternatively, when the value at node (y) 344 is at a low voltage level, the voltage level at the node (z) 340 is at a logic high voltage level. The p-channel transistor (P1) 312 maintains a voltage level of the node 342 at a logic high voltage level, regardless of the value of the data (d) at the data input 306, and the logic high voltage level of the node 342 activates the n-channel transistor (n$_4$) 332, turning on the n-channel transistor (n$_3$) 330. The voltage level at the node (y) 344 is held at a voltage low level by the n-channel transistors (n$_3$ and n$_4$) 330 and 332. The transistors 312, 316, 330 and 332 actively hold the state information of the circuit device 300.

In a particular embodiment, it may be desirable to design the single clocked transistor 326 and its output terminal such that its associated capacitance is small relative to a capacitance of the node (x) 342 and the node (y) 344. If the data (d) switches when the clock signal (φ) is low, charge sharing through the n-channel transistors (N1 or N2) 324 or 328 (between either the node (x) 342 or the node (y) 344 and the virtual ground at node 338) could perturb the state of the latched data. If the capacitance of the node 338 is kept low, such events can be avoided or at least reduced.

In general, the voltage level at the node 338 may vary between a virtual ground and a floating voltage level. In a particular illustrative embodiment, the voltage level at the node 338 may vary from approximately zero volts to a voltage level that is approximately equal to a difference between a voltage supply ($V_{DD}$) and the voltage threshold ($V_T$) of the n-channel transistor (N$_1$) 324 or the n-channel transistor (N$_2$) 328 (i.e., $0V \leq V_{338} \leq V_{DD} - V_T$). In general, the node 338 can be charged to a voltage level ($V_{DD} - V_T$) by one or both of the p-channel transistors (p$_1$ and p$_2$) 312 and 316. Since the node 338 can be actively held at two voltages (e.g., zero or $V_{DD} - V_T$), the node 338 is not shared across multiple latches.

In a particular illustrative embodiment, the circuit device 300 may be implemented using 65-nm semiconductor fabrication technology and may be used for mobile applications, such as portable computing devices, mobile communication devices, other devices, or any combination thereof. In a particular illustrative example, the 65-nm semiconductor fabrication technology may allow for a device width of approximately 150 nm. In a particular illustrative, non-limiting example, the transistors 312, 316, 330 and 332 and the inverters 318 and 322 may be implemented as 150 nm-width transistors and the transistors 324 and 328 may be implemented as transistors that have a width that is greater than 150-nm. In a particular illustrative, non-limiting embodiment, the circuit device 300 may be designed to conserve dynamic clock power while satisfying robustness constraints, such as the ability to operate at all process corners (i.e., at all boundary scenarios) with a supply voltage ranging from 0.8 to 1.2 V and a temperature ranging from 0 to 100° C. In another particular illustrative embodiment, it may be desirable that the circuit device 300 support pulsed clocks to enhance energy efficiency.

In general, it should be understood that the circuit device 300 represents a particular illustrative, non-limiting example of a system that uses a single clocked transistor 326. However, other implementations and embodiments are contemplated. For example, in an alternative embodiment, the p-channel transistors 310, 312, 314, and 316 may be replaced with n-channel transistors, the n-channel transistors 324, 326, 328, 330, and 332 may be replaced with p-channel transistors, the supply voltage terminal 302 may be replaced with a ground terminal, and the ground terminal 304 may be replaced with a supply voltage terminal. In this instance, the circuit device 300 can hold state when the clock is high, instead of low. Additionally, the circuit device 300 can propagate data from the input 306 to the output 346 when the clock is low, instead of high. Additionally, other circuit devices are contemplated that take advantage of the single clocked transistor 326.

Figure 4:
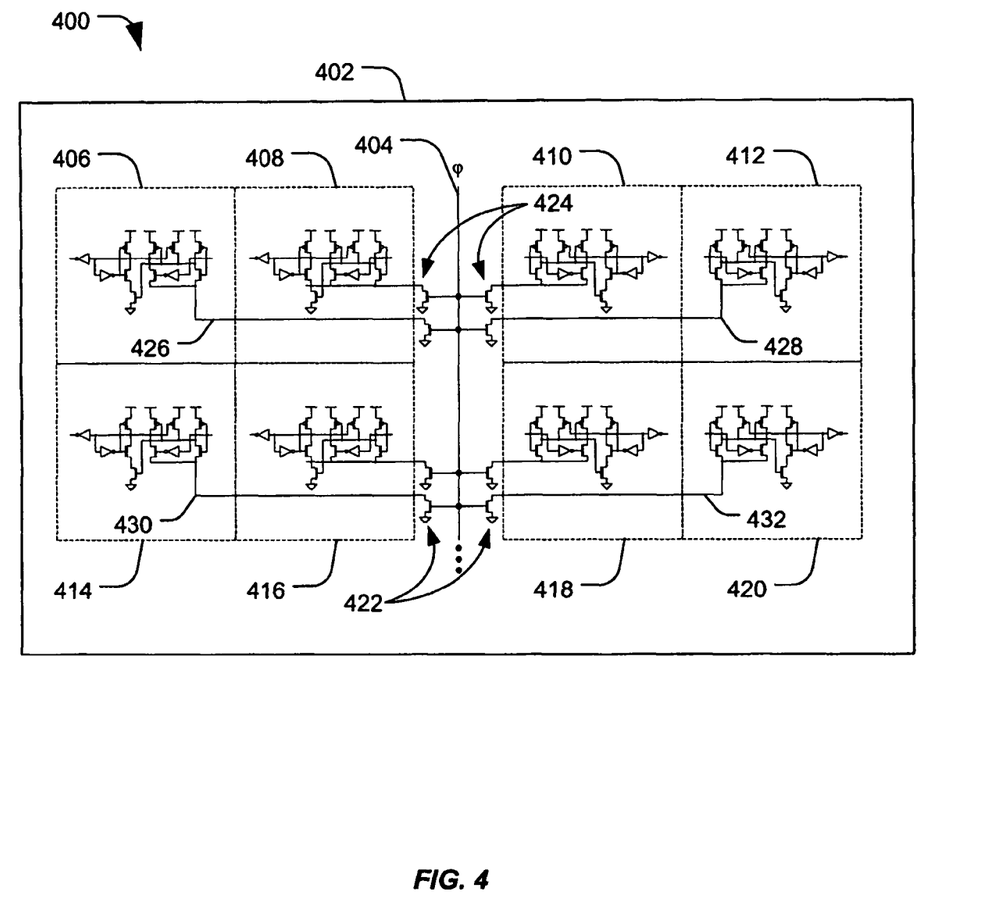
FIG. 4 is a partial schematic circuit diagram of a portion of a circuit device including multiple latch circuit devices having respective clocked transistors.

FIG. 4 is a partial schematic circuit diagram of a portion of a circuit device 400 including a circuit substrate 402 that can include multiple sequential circuit elements, such as the circuit elements 102, 202 and 300 in FIGS. 1, 2 and 3, respectively. The circuit substrate 402 may include multiple sequential logic circuit devices, such as latch circuit devices 406, 408, 410, 412, 414, 416, 418 and 420, each having respective clocked transistors, such as the transistors 422 and 424. Additionally the circuit substrate 402 may include a clock bus 404.

As shown in FIG. 4, a clock bus 404 may be routed in a single direction, reducing the capacitance of the clock bus 404, for example. In this embodiment, the clocked transistors, such as the clocked transistors 422 and 424 of several latch circuit devices 406, 408, 410, 412, 414, 416, 418 and 420 can be positioned adjacent to the clock bus 404.

As shown, the clock bus 404 is routed vertically, and the horizontal wires, such as the wires 426, 428, 430 and 432 correspond to the node 338 in FIG. 3. Thus, the wires 426, 428, 430 and 432 provide a switched voltage that varies between a virtual ground voltage level and a floating voltage level. In general, the virtual ground voltage level carried by the nodes, such as the wires 426, 428, 430 and 432 is not shared among the latch circuit devices 406, 408, 410, 412, 414, 416, 418 and 420 to avoid contention between the various latches. While the particular arrangement shown in FIG. 4 increases respective lengths of the wires 426, 428, 430 and 432, the clock bus 404 is shorter than if the clock bus were routed directly to each of the latch devices 406, 408, 410, 412, 414, 416, 418 and 420.

From a power standpoint, the resulting circuit 400 consumes less power than if the clock bus 404 included separate clock routing for each latch circuit device. For example, the switching activity of the virtual ground wires 426, 428, 430 and 432 may be low compared to the switching activity of the clock signal on the clock bus 404, since the virtual ground wires 426, 428, 430 and 432 toggle only when the data changes. Additionally, the virtual ground wires 426, 428, 430 and 432 can have a reduced voltage swing compared to the clock signal, since the wires 426, 428, 430 and 432 vary between zero and $V_{DD}-V_T$ volts while the clock bus 404 varies between zero and $V_{DD}$. Further, grouping the clocked transistors, such as clocked transistors 422 and 424, can also reduce the number of vias through layers of the substrate. Current semiconductor fabrication technologies typically require each via to be surrounded by a fairly large area of metal. Consequently, vias and their associated metal areas introduce additional interconnect capacitances, which capacitances can be reduced by lowering the number of vias. This particular feature may vary based on the design technology.

Figure 5:
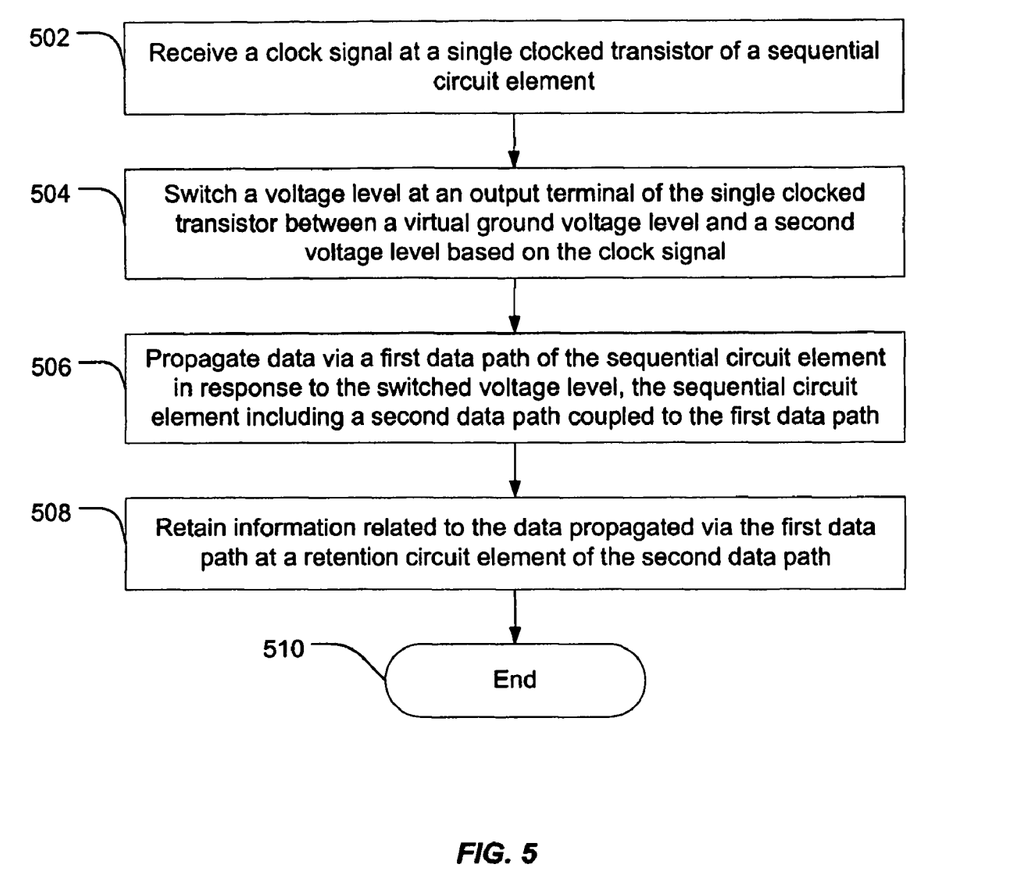
FIG. 5 is a flow diagram of a particular illustrative embodiment of a method of operating a sequential circuit device including a single clocked transistor.

FIG. 5 is a flow diagram of a particular illustrative embodiment of a method of operating a sequential circuit device. At 502, a clock signal is received at a single clocked transistor of a sequential circuit element. Advancing to 504, a voltage level at an output of the single clocked transistor switches between a virtual ground voltage level and a second voltage level (such as a floating voltage level, e.g., $V_{DD}-V_T$) based on the clock signal. Moving to 506, data is propagated via a first data path of the sequential circuit element in response to the output of the single clocked transistor. The sequential circuit element includes a second data path coupled to the first data path. Proceeding to 508, information related to the data propagated via the first data path is retained at a retention circuit element of the second data path. The method terminates at 510.

In general, the method described with respect to FIG. 5 can be performed for a plurality of samples of data at a clock input of a sequential circuit device and may be implemented using a circuit device, such as the circuit devices shown in FIGS. 1-4.

Figure 6:
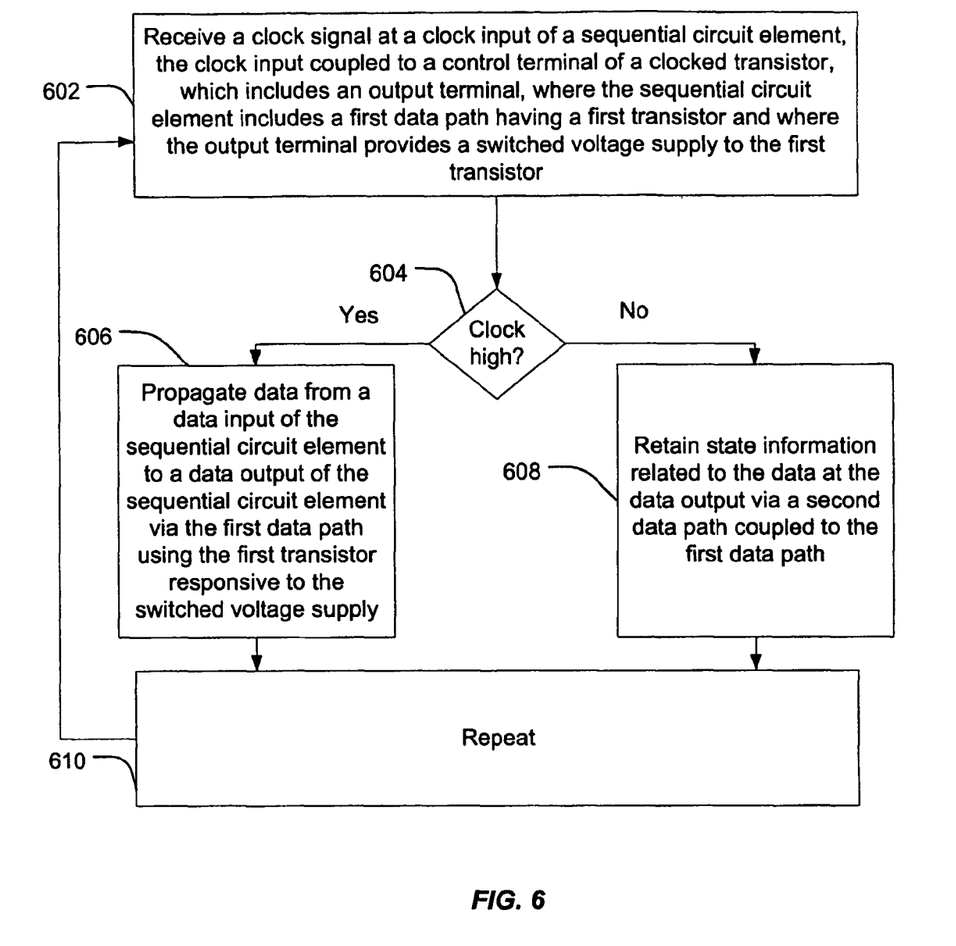
FIG. 6 is a flow diagram of a second particular illustrative embodiment of a method of operating a sequential circuit device including a single clocked transistor.

FIG. 6 is a flow diagram of a second particular illustrative embodiment of a method of operating a sequential circuit device. At 602, a clock signal is received at a clock input of a sequential circuit element. The clock input is coupled to a control terminal of a clocked transistor, which includes an output terminal that provides a switched voltage supply to a first transistor in a first data path in response to receiving the clock signal. The switched voltage level may switch between a virtual ground voltage level at the output terminal when the clock signal is at a logic high level and a floating voltage level (e.g., $V_{DD}-V_T$) at the output terminal when the clock signal is at a logic low level.

If the clock signal is high at 604, the method advances to 606 and data is propagated from a data input of the sequential circuit element to a data output of the sequential circuit element via a first data path having a first transistor responsive to the output terminal of the clocked transistor. In a particular illustrative embodiment, the first data path can include a plurality of transistors, where at least two transistors of the plurality of transistors are coupled to the output terminal. Returning to 604, if the clock signal is low, the method advances to 608 and state information related to the data at the data output is retained via a data retention element of a second data path coupled to the first data path. The method advances to 610 and the method is repeated by returning to 604 to evaluate the clock signal.

In general, the method described with respect to FIG. 6 can be performed for a plurality of samples of data at a clock input of a sequential circuit device, such as the circuit devices shown in FIGS. 1-4.

Figure 7:
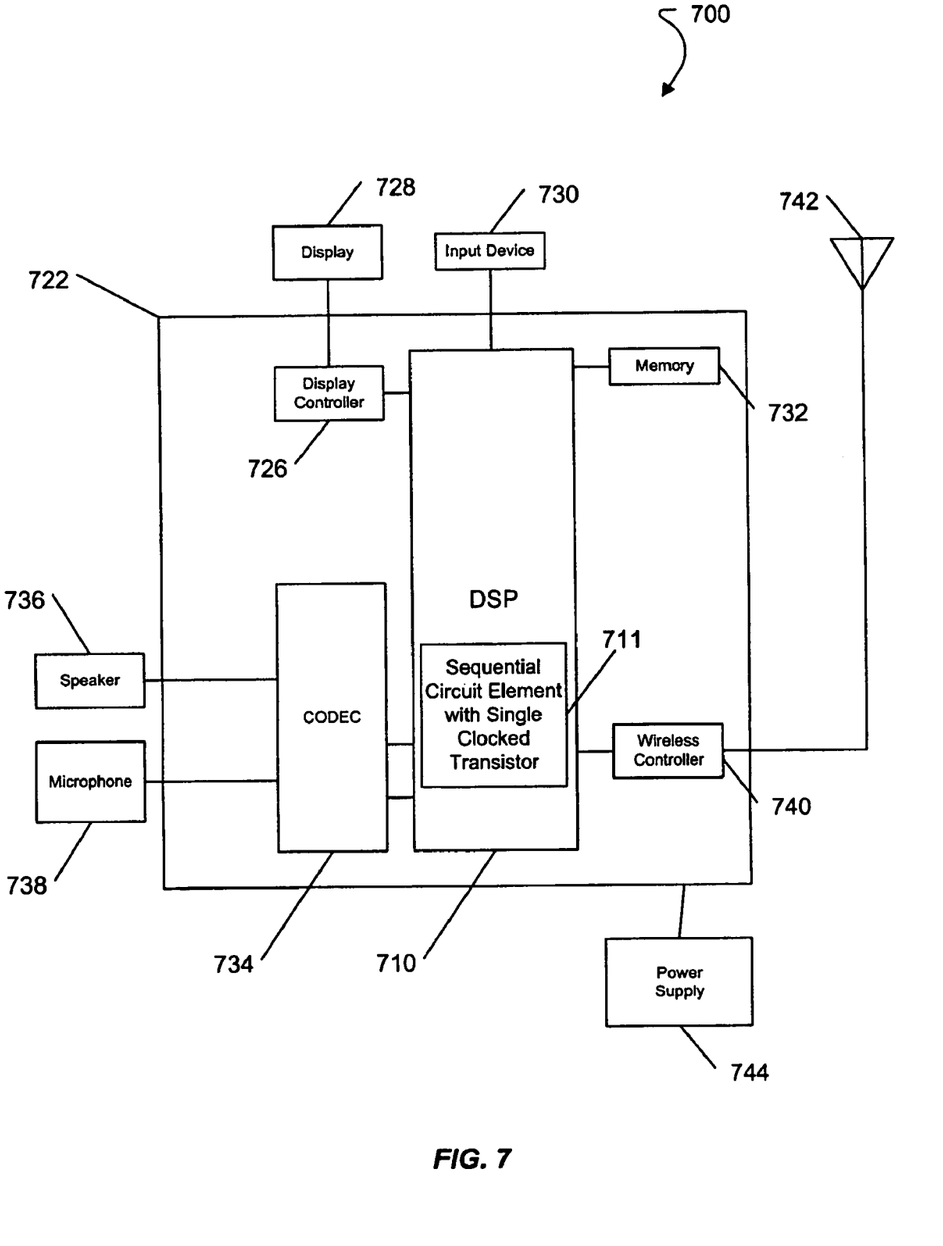
FIG. 7 is a block diagram of a communications device in which the sequential circuit devices and methods of FIGS. 1-6 can be implemented.

FIG. 7 is a block diagram of a portable communications device that is generally designated as 700 in which the sequential circuit devices and methods of FIGS. 1-6 can be implemented. The portable communications device 700 includes an on-chip system 722 that includes a processor, such as a digital signal processor 710. The digital signal processor 710 includes at least one device having a sequential circuit element with a single clocked transistor 711, as described with respect to FIGS. 1-6. The sequential circuit element can be a logic latch circuit, a logic flip-flop circuit, another logic circuit, or any combination thereof.

FIG. 7 also shows a display controller 726 that is coupled to the digital signal processor 710 and to a display 728. Moreover, an input device 730 is coupled to the digital signal processor 710. Additionally, a memory 732 is coupled to the digital signal processor 710. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, a power supply 744 is coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each is coupled to a component of the on-chip system 722.

In a particular illustrative embodiment, the sequential circuit element with the single clocked transistor 711 may be used to enhance overall performance of the portable communications device 700. In particular, the sequential circuit element with the single clocked transistor 711 may reduce overall clock power consumption of the device 700, thereby extending battery life, improving power efficiencies overall and enhancing the performance of the device 700.

It should be understood that while the sequential circuit element with the single clocked transistor 711 is shown only within the digital signal processor 710, the sequential circuit element with the single clocked transistor 711 may be provided in other components, including the display controller 726, the wireless controller 740, the CODEC 734, or any other component that includes sequential logic, such as a logical latch circuit, a logical flip-flop circuit, other clocked circuitry, or any combination thereof.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A method comprising:
   receiving first data at a first transistor of a retention circuit from a first output of a first input element, wherein the first transistor selectively couples a second output of a second input element to a first supply terminal in response to the first data, wherein the first transistor selectively blocks a current path between the second output and the first supply terminal, and wherein the second input element is responsive to the first input element; and
   wherein a single clocked transistor is configured to provide a virtual voltage level to the first input element and to the second input element when a clock signal activates the single clocked transistor, wherein when the single clocked transistor is deactivated while the second data has a first logical value, the current path is held open by the first transistor responsive to the keeper transistor and by the second transistor responsive to the inverter.

2. The method of claim 1, wherein the first supply terminal is a ground terminal.

3. The method of claim 2, wherein the first transistor is configured to block the current path to reduce contention during a low-to-high transition of the second output.

4. The method of claim 1, further comprising receiving second data at a keeper transistor from the second input element, wherein the keeper transistor selectively couples the first output to a second supply terminal in response to the second data.

5. The method of claim 4, wherein the keeper transistor is a p-channel transistor, wherein the keeper transistor provides a virtual supply voltage level to the first output when the second data is at a logic level low.

6. The method of claim 5, wherein the first transistor and the keeper transistor are weak transistors compared to transistors of the first and second input elements.

7. The method of claim 5, wherein the first transistor and the keeper transistor are long channel transistors compared to transistors of the first and second input elements.

8. The method of claim 4, wherein the retention circuit comprises an inverter coupled to the second output and configured to receive the second data and to provide inverted second data to a second transistor.

9. The method of claim 8, further comprising:
   switching the second transistor in response to the inverted second data to selectively block the current path.

10. The method of claim 9, wherein when the single clocked transistor is deactivated while the second data has a second logical value, the current path is blocked by the second transistor responsive to the inverter.

11. The method of claim 9, wherein the virtual voltage level is a virtual ground.

12. The method of claim 9, wherein the virtual voltage level is a virtual supply voltage.

13. The method of claim 1, wherein the first transistor is a n-channel transistor.

14. A circuit device comprising: a first input element comprising a first input and a first output; a second input element responsive to the first output and comprising a second output; and a retention circuit configured to selectively couple the second output to a first supply terminal, wherein the retention circuit comprises a first transistor responsive to the first output to selectively block a current path between the second output and the first supply terminal; and
   further comprising a single clocked transistor configured to provide a virtual voltage level to the first input element and to the second input element when the single clocked transistor is activated, and wherein when the single clocked transistor is deactivated while the second data has a first logical value, the current path is held in a conductive state by the first transistor responsive to the keeper device and by the second transistor responsive to the inverter.

15. The circuit device of claim 14, further comprising a single clocked transistor configured to provide a virtual voltage level to the first input element and to the second input element when the single clocked transistor is activated.

16. The circuit device of claim 14, wherein the first input element is configured to receive input data at the first input and to provide first data at the first output, and wherein the second input element is configured to receive inverted input data and to receive the first data, the second input element further configured to provide second data at the second output.

17. The circuit device of claim 14, wherein the first supply terminal is a ground terminal and wherein a gate of the first transistor is coupled to the first output.

18. The circuit device of claim 17, wherein the first transistor is configured to block the current path to reduce contention during a low-to-high transition of the second output.

19. The circuit device of claim 18, further comprising a keeper device responsive to the second output to selectively couple the first output to a second supply terminal.

20. The circuit device of claim 19, wherein the keeper device is a keeper transistor, wherein the first transistor and the keeper transistor are weak transistors compared to transistors of the first and second input elements.

21. The circuit device of claim 19, wherein the keeper device is a keeper transistor, wherein the first transistor and the keeper transistor are long channel transistors compared to transistors of the first and second input elements.

22. The circuit device of claim 19, wherein the keeper device is a p-channel transistor, wherein the keeper device provides a virtual supply voltage level to the first output when the second output is at a logic level low.

23. The circuit device of claim 16, wherein the retention circuit further comprises:
an inverter coupled to receive the second data; and
a second transistor responsive to inverted second data from the inverter to selectively block the current path.

24. The circuit device of claim 23, wherein when the single clocked transistor is deactivated while the second data has a second logical value, the current path is blocked by the second transistor responsive to the inverter.

25. The circuit device of claim 14, wherein the first transistor is an n-channel transistor.

26. The circuit device of claim 14, wherein the first supply terminal is a ground terminal.

27. The circuit device of claim 14, integrated in at least one semiconductor die.

28. A circuit device comprising: a first input element comprising:
a first input and a first output;
a second input element responsive to the first output and comprising a second output;
a retention circuit configured to selectively couple the second output to a supply terminal, wherein the retention circuit comprises a first transistor responsive to the first output to selectively block a current path between the second output and the supply terminal; and
a single clocked transistor configured to provide a virtual voltage level to the first input element and the second input element when the single clocked transistor is activated,
wherein the first input element is configured to receive input data at the first input and to provide first data at the first output, and wherein the second input element is configured to receive inverted input data and to receive the first data, the second input element further configured to provide second data at the second output.

29. The circuit device of claim 28, wherein the single clocked transistor is configured to provide a floating voltage level when the single clocked transistor is deactivated.

30. The circuit device of claim 28, wherein the single clocked transistor is activated when a clock signal is at a logic level high.

31. The circuit device of claim 28, integrated in at least one semiconductor die.

32. A circuit device comprising:
means for receiving input data and generating first data at a first data output;
means for receiving the first data and generating second data at a second data output; and
retention means for selectively coupling the second output to a first supply terminal, wherein the retention means comprises a first transistor responsive to the first output to selectively block a current path between the second output and the first supply terminal.

33. The circuit device of claim 32, wherein the first transistor is configured to block the current path to reduce contention during a low-to-high transition of the second output.

34. The circuit device of claim 32, further comprising means for selectively coupling the first output to a second supply terminal responsive to the second data.

35. The circuit device of claim 34, wherein the retention means further comprises means for selectively blocking the current path in response to inverted second data.

36. The circuit device of claim 35, wherein the retention means further comprises an inverter coupled to the second output and configured to receive the second data and to provide the inverted second data to the means for selectively blocking the current path.

37. The circuit device of claim 32, configured as a latch.

* * * * *

UNITED STATES PATENT AND TRADEMARK OFFICE
CERTIFICATE OF CORRECTION

| | | |
|---|---|---|
| PATENT NO. | : 7,746,137 B2 | Page 1 of 1 |
| APPLICATION NO. | : 11/845950 | |
| DATED | : June 29, 2010 | |
| INVENTOR(S) | : Saint-Laurent et al. | |

It is certified that error appears in the above-identified patent and that said Letters Patent is hereby corrected as shown below:

Column 11, line 64, claim 1: "the keeper transistor" to read as --a keeper transistor--

Column 11, line 65, claim 1: "the second transistor" to read as --a second transistor--

Column 11, line 65, claim 1: "the inverter" to read as --an inverter--

Column 12, line 05, claim 4: "a keeper transistor" to read as --the keeper transistor--

Column 12, line 22, claim 8: "a second transistor" to read as --the second transistor--

Column 12, line 50, claim 14: "the keeper device" to read as --a keeper device--

Column 12, line 51, claim 14: "the second transistor" to read as --a second transistor--

Column 12, line 52, claim 14: "the inverter" to read as --an inverter--

Signed and Sealed this
Twenty-first Day of February, 2012

David J. Kappos
*Director of the United States Patent and Trademark Office*